(12) United States Patent
Zhang et al.

(10) Patent No.: US 11,462,576 B2
(45) Date of Patent: Oct. 4, 2022

(54) DISPLAY PANEL, MANUFACTURING METHOD THEREOF, AND DISPLAY DEVICE

(71) Applicant: TCL CHINA STAR OPTOELECTRONICS TECHNOLOGY CO., LTD., Shenzhen (CN)

(72) Inventors: Yihe Zhang, Shenzhen (CN); Duyeon Han, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 35 days.

(21) Appl. No.: 17/057,029

(22) PCT Filed: Sep. 4, 2020

(86) PCT No.: PCT/CN2020/113373
§ 371 (c)(1),
(2) Date: Nov. 19, 2020

(87) PCT Pub. No.: WO2022/007161
PCT Pub. Date: Jan. 13, 2022

(65) Prior Publication Data
US 2022/0013548 A1 Jan. 13, 2022

(30) Foreign Application Priority Data
Jul. 8, 2020 (CN) .......................... 202010653807.0

(51) Int. Cl.
*H01L 27/12* (2006.01)
*H01L 25/16* (2006.01)
(Continued)

(52) U.S. Cl.
CPC ........ *H01L 27/1262* (2013.01); *H01L 23/562* (2013.01); *H01L 25/167* (2013.01); *H01L 27/124* (2013.01); *H01L 33/60* (2013.01)

(58) Field of Classification Search
None
See application file for complete search history.

(56) References Cited

U.S. PATENT DOCUMENTS

2006/0108653 A1* 5/2006 Koo .................... C23C 16/0272
257/419
2014/0291633 A1* 10/2014 Baek .................. H01L 51/0097
428/411.1

(Continued)

FOREIGN PATENT DOCUMENTS

| CN | 105355634 A | 2/2016 |
| CN | 107219660 A | 9/2017 |

(Continued)

*Primary Examiner* — Bo B Jang
(74) *Attorney, Agent, or Firm* — PV IP PC; Wei Te Chung; Ude Lu

(57) ABSTRACT

The present disclosure provides a display panel, a manufacturing method thereof, and a display device. The display panel includes a display area and a non-display area, and the non-display area has GOA regions. The display panel further includes a first substrate, an array substrate, and an anti-deformation layer. In the present disclosure, the anti-deformation layer is disposed on a lower surface of the first substrate at a position corresponding to the GOA regions. Metal material of the GOA regions is same as metal material of the anti-deformation layer, so that metal expansion coefficient of upper and lower surfaces of the first substrate are same, thereby effectively preventing warpage of the first substrate and the array substrate.

15 Claims, 5 Drawing Sheets

(51) Int. Cl.
*H01L 33/60* (2010.01)
*H01L 23/00* (2006.01)

(56) References Cited

U.S. PATENT DOCUMENTS

| | | | | |
|---|---|---|---|---|
| 2016/0254329 | A1* | 9/2016 | Hsieh | H01L 27/3244 257/72 |
| 2016/0323993 | A1* | 11/2016 | Kwon | G02F 1/133305 |
| 2017/0148822 | A1* | 5/2017 | Hu | H01L 27/1288 |
| 2021/0035959 | A1* | 2/2021 | Yang | H01L 33/507 |
| 2021/0183893 | A1* | 6/2021 | Feng | H01L 24/05 |

FOREIGN PATENT DOCUMENTS

| | | | |
|---|---|---|---|
| CN | 107300794 | A | 10/2017 |
| CN | 108231730 | A | 6/2018 |
| CN | 109407436 | A | 3/2019 |
| CN | 209132547 | U | 7/2019 |
| CN | 110211527 | A | 9/2019 |
| CN | 111243486 | A | 6/2020 |
| CN | 111276052 | A | 6/2020 |

\* cited by examiner

DISPLAY PANEL, MANUFACTURING METHOD THEREOF, AND DISPLAY DEVICE

RELATED APPLICATIONS

This application is a National Phase of PCT Patent Application No. PCT/CN2020/113373 having international filing date of Sep. 4, 2020, which claims the benefit of priority of Chinese Patent Application No. 202010653807.0 filed on Jul. 8, 2020. The contents of the above applications are all incorporated by reference as if fully set forth herein in their entirety.

FIELD OF INVENTION

The present disclosure relates to the field of display technology, in particular to a display panel, a manufacturing method thereof, and a display device.

BACKGROUND OF INVENTION

In existing display products, mini light-emitting diode (LED) transistors are assembled on printed circuit boards (PCBs). However, assembling the mini LED transistors on the PCBs requires high technical costs and high power consumption. Therefore, it can only be driven passively, and a number of required scan/data signals is low due to low partitions, which is not conducive to realization of large-scale display panels. However, application of mini LED transistors on glass substrates is more competitive in the market than on the PCBs, as the former has better display performance and is suitable for large-screen products, and can also greatly reduce manufacturing costs and improve product cost-effectiveness. Active driving can achieve a high number of partitions and makes screen color display effect better. Active mini LEDs need to control thin film transistors (TFTs) or metal oxide semiconductor (MOS) during operation, and usually need to input in-plane scan signals or data signals, and the higher the number of partitions, the more scan/data signals are required.

Specially, as shown in FIG. 1, an existing display panel 2000 comprises a display area 500 and a non-display area 600, and the non-display area 600 has a fan-out region 601 and a chip on film (COF) region 602.

As shown in FIG. 2, the existing display panel 2000 further comprises a first substrate 501, an array substrate 502 and LEDs 503. Wherein, the first substrate 501 and the array substrate 502 extend from the display area 500 to the non-display area 600, and the LEDs 503 are disposed in the display area 500.

Refer to FIG. 1 and FIG. 2, the array substrate 502 comprises a plurality of data lines 701 and a plurality of scan lines 702, which extend from the display area 500 to the fan-out region 601 and connect to the COF region 602. The data lines in the fan-out region 601 are data signal lines, and the scan lines are scan signal lines. Wherein, the scan lines 702 connect to GOA regions (not shown) through switching elements. Therefore, in order to splice small-sized display panels into a large-sized display panel, those skilled in the art usually feed scan signals, data signals, VDD signals, and VSS signals uniformly from one side of the panel in order to simplify splicing process.

However, a large-size display panel is formed by splicing several small-size display panels, and optical performance at the splicing position is prone to sudden changes, resulting in poor display, and splicing tolerance must be reserved at the splicing position, which limits a border design, and thus display panels with no splicing is still a development trend. When the size of a large-size display panel increases, the number of partitions on each small-size display panel also increases, while the number of scan or data signals will double, and the number of COF (chip on FPC) will increase accordingly. When the size of the large-size display panel increases, the amount of glass warpage will increase correspondingly, which will increase the difficulty of subsequent manufacturing processes and increase the probability of dimming.

Technical Problem

The purpose of the present disclosure is to provide a display panel, a manufacturing method thereof, and a display device, to solve technical problems such as the existing large-size backlights need to be spliced, and the splicing cost is relatively high, while the optical performance at the splicing part is uneven, making it difficult to realize left and right dual drives.

SUMMARY OF INVENTION

In order to achieve the above purpose, the present disclosure provides a display panel, which comprises a display area and a non-display area around the display area, and the non-display area has GOA regions; the display panel further comprises:

A first substrate extended from the display area to the non-display area; an array substrate disposed on a surface of the first substrate and extended from the display area to the non-display area; and an anti-deformation layer disposed on a surface of the first substrate away from the array substrate and at the GOA regions.

In addition, the display panel further comprises: a reflective layer disposed on a surface of the array substrate away from the first substrate; a plurality of LEDs distributed on the reflective layer; a first protective layer disposed on the of the array substrate away from the first substrate and covering the LEDs.

In addition, the display panel further comprises: a second protective layer disposed on the surface of the first substrate away from the array substrate and covering the anti-deformation layer.

In addition, material of the reflection comprises white oil.

In addition, the array substrate at the display area comprises:

A plurality of data lines, a plurality of scan lines and a plurality of pixel units, wherein the plurality of scan lines and the plurality of data lines are arranged in a crisscross manner, and two adjacent scan lines and two adjacent data lines enclose a pixel region to form a plurality of pixel areas arranged in array, wherein each of the pixel region is provided with each of the pixel unit, and each of the pixel units corresponds to each of the LEDs.

In addition, the array substrate located at the non-display area comprises:

A plurality of first GOA units and a plurality of second GOA units located at the GOA regions, the first GOA units and the second GOA units are located at two opposite edges of the display area respectively; a plurality of fan-out wires located at the non-display area except the GOA regions; and a plurality of COF circuits connected to the fan-out wires.

In addition, material of the anti-deformation layer comprises metal.

To achieve the above purpose, the present disclosure further provides a manufacturing method for manufacturing the display panel mentioned above, wherein the display panel comprises a display area and a non-display area around the display area, and the non-display area has GOA regions, wherein the manufacturing method comprises the following steps:

Providing a first substrate; forming an array substrate on a surface of the first substrate and extended from the display area to the non-display area; and forming an anti-deformation layer on the other surface of the first substrate at the GOA regions.

In addition, after the step of forming the array substrate on the surface of the first substrate and before the step of forming the anti-deformation layer, the manufacturing method further comprises:

Forming a reflective layer on the array substrate; attaching a plurality of LEDs on the reflective layer; forming a first protective layer on a surface of the array substrate away from the first substrate and covering the LEDs.

In addition, the step of forming the array substrate on the surface of the first substrate comprises:

Forming a plurality of data lines, a plurality of scan lines and a plurality of pixel units, wherein the plurality of scan lines and the plurality of data lines are arranged in a crisscross manner, and two adjacent scan lines and two adjacent data lines enclose a pixel unit to form a plurality of pixel regions arranged in array, wherein each of the pixel regions is provided with each of the pixel units, and each of the pixel units corresponds to each of the LEDs.

In addition, the step of forming the array substrate on the surface of the first substrate further comprises:

Forming a plurality of first GOA units and a plurality of GOA units in the GOA regions, the first GOA units and the second GOA units are disposed at two opposite edges of the display area; forming a plurality of fan-out wires in the display area except the GOA regions; and forming a plurality of COF circuits connected to the fan-out wires in the non-display area close to the position of the fan-out wires.

In addition, after the step of forming the anti-deformation layer, the manufacturing method further comprises: forming a second protective layer on a surface of the first substrate away from the array substrate and covering the anti-deformation layer.

In addition, after the step of forming a second protective layer, the manufacturing method further comprises: performing a bonding processing on the array substrate in the non-display area.

In addition, material of the anti-deformation layer comprises metal.

In addition, material of the reflective layer comprises white oil.

To achieve the above purpose, the present disclosure further provides a display device, which comprises the display panel mentioned above, and the display panel comprises a display area and a non-display area around the display area, and the non-display area has GOA regions; the display panel further comprises a first substrate extended from the display area to the non-display area; an array substrate disposed on a surface of the first substrate and extended from the display area to the non-display area; and an anti-deformation layer disposed on a surface of the first substrate away from the array substrate and located at the GOA regions.

In addition, the display panel further comprises:

A reflective layer disposed on a surface of the array substrate away from the first substrate; a plurality of LEDs distributed on the reflective layer; a first protective layer disposed on the surface of the array substrate away from the first substrate and covering the LEDs; and a second protective layer disposed on the surface of the first substrate away from the array substrate and covering the anti-deformation layer.

In addition, the array substrate located at the display area comprises:

A plurality of data lines, a plurality of scan lines and a plurality of pixel units, wherein the plurality of scan lines and the plurality of data lines are arranged in a crisscross manner, and two adjacent scan lines and two adjacent data lines enclose a pixel region to form a plurality of pixel regions arranged in array, and each of the pixel regions is provided with each of the pixel units, and each of the pixel units corresponds to each of the LEDs.

In addition, the array substrate located at the non-display area comprises:

A plurality of first GOA units and a plurality of second GOA units located in the GOA region, the first GOA units and the second GOA units are disposed at two opposite edges of the display area respectively; a plurality of fan-out wires disposed in the non-display area except the GOA regions; and a plurality of COF circuits connected to the fan-out wires.

In addition, the display device is electronic paper, mobile phones, tablet computers, televisions, monitors, notebook computers, digital photo frames, or navigators.

Beneficial Effect

The technical effect of the present disclosure is to provide a display panel, a manufacturing method thereof, and a display device. By setting an anti-deformation layer on the lower surface of the first substrate corresponding to the position of the GOA regions, wherein the metal materials of the GOA regions are same as the metal materials of the anti-deformation layer, metal thermal expansion coefficients of the upper and lower surfaces of the first substrate are the same, thereby effectively reducing warpage of the first substrate and the array substrate.

DESCRIPTION OF DRAWINGS

The following describes specific embodiments of the present disclosure in detail with reference to the accompanying drawings, which will make the technical solutions and other beneficial effects of the present disclosure obvious.

Figure 1:
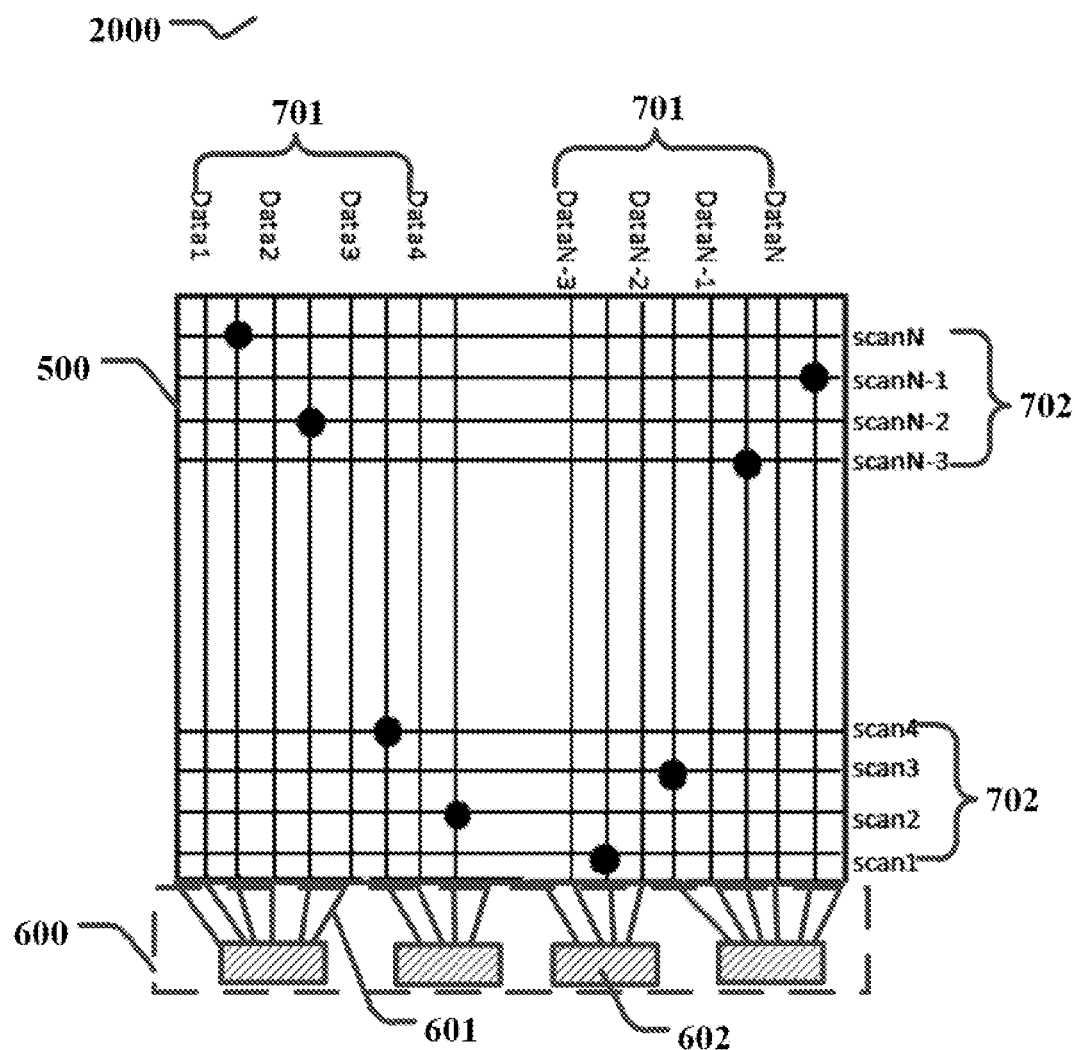
FIG. 1 is a schematic structural diagram of a display panel in the prior art.
Figure 2:
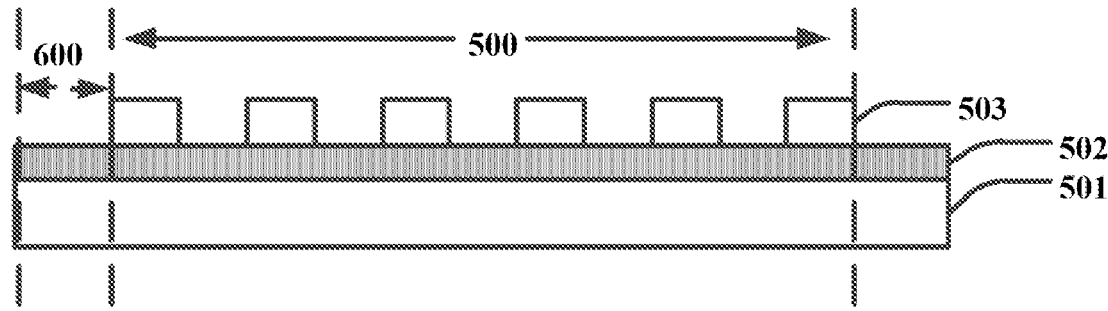
FIG. 2 is a planar diagram of the display panel in the prior art.

Reference numbers of elements are as follows:

| | |
|---|---|
| 1000 display panel; | 100 display area; |
| 200 non-display area; | 201 GOA region; |
| 202 fan-out region; | 203 COF region; |
| 301 first substrate; | 302 array substrate; |
| 303 reflective layer; | 304 LED; |
| 305 first protective layer; | 306 anti-deformation layer; |
| 307 second protective layer; | 101 data line; |
| 102 scan line; | 103 pixel unit; |
| 104 pixel region; | 2031 first GOA unit; |
| 2032 second GOA unit; | 2021 fan-out wire; |
| 2031a COF circuit; | 401 data signal line; |
| 402 GOA signal line; | |
| 2000 existing display panel; | 500 display area; |
| 600 non-display area; | 601 fan-out region; |
| 602 COF region; | 501 first substrate; |
| 502 array substrate; | 503 LED; |
| 701 data line; | 702 scan line. |

DETAILED DESCRIPTION OF PREFERRED EMBODIMENTS

The technical solutions in the embodiments of the present disclosure will be clearly and completely described below in conjunction with the drawings in the embodiments of the present disclosure. Obviously, the described embodiments are only a part of the embodiments of the present disclosure, rather than all the embodiments. Based on the embodiments in the present disclosure, all other embodiments obtained by those skilled in the art without creative work fall within the protection scope of this application.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

The following description provides various embodiments or examples for implementing various structures of the present disclosure. To simplify the description of the present disclosure, parts and settings of specific examples are described as follows. Certainly, they are only illustrative, and are not intended to limit the present disclosure. Further, reference numerals and reference letters may be repeated in different examples. This repetition is for purposes of simplicity and clarity and does not indicate a relationship of the various embodiments and/or the settings. Furthermore, the present disclosure provides specific examples of various processes and materials, however, applications of other processes and/or other materials may be appreciated those skilled in the art.

Figure 3:
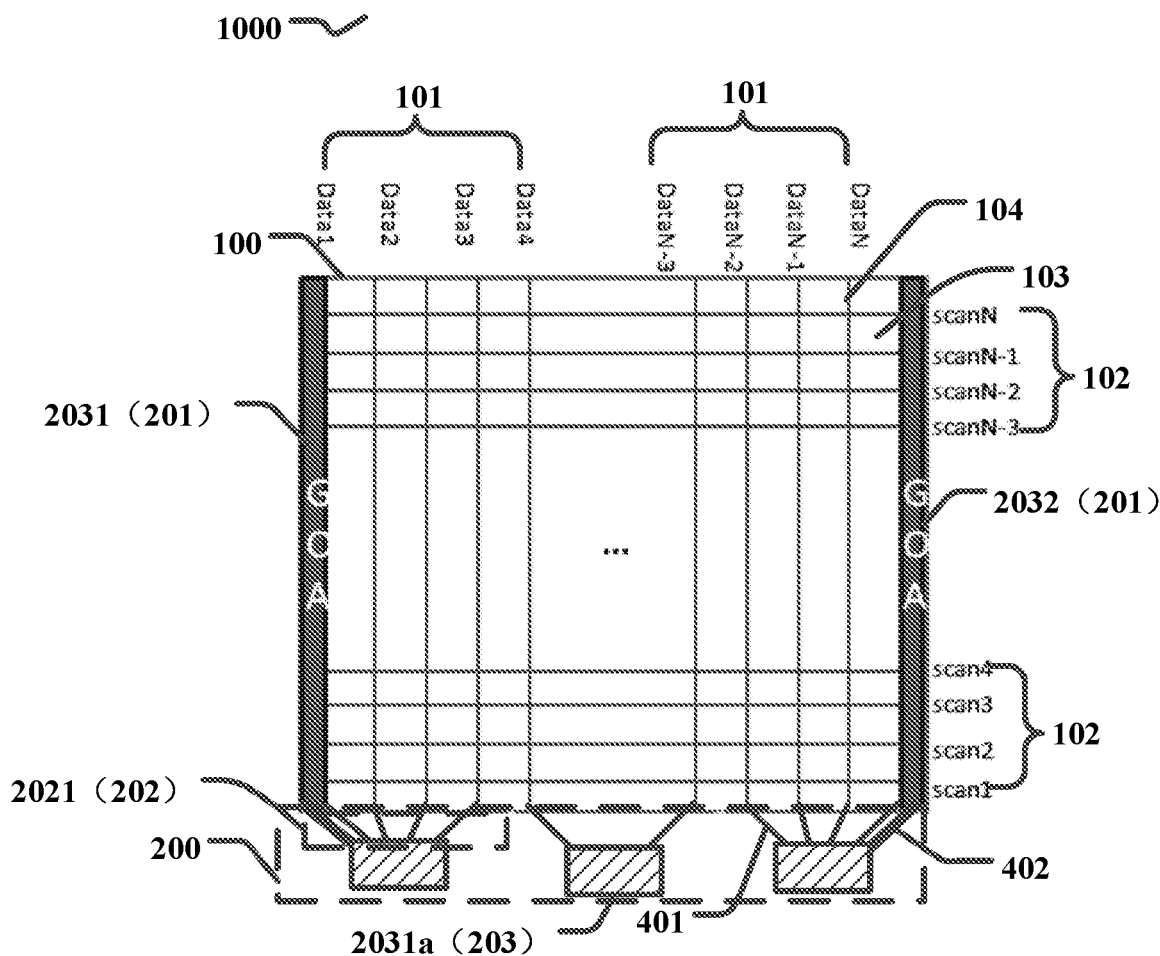
FIG. 3 is a schematic structural diagram of a display panel of an embodiment of the present disclosure.

As shown in FIG. 3, the present embodiments provide a display panel 1000 comprising a display area 100 and a non-display area 200 around the display area 100. The non-display area 200 has GOA regions 201, a fan-out region 202, and a COF region 203. Wherein, two GOA regions 201 are disposed at two opposite edges of the display area 100 respectively.

Figure 4:
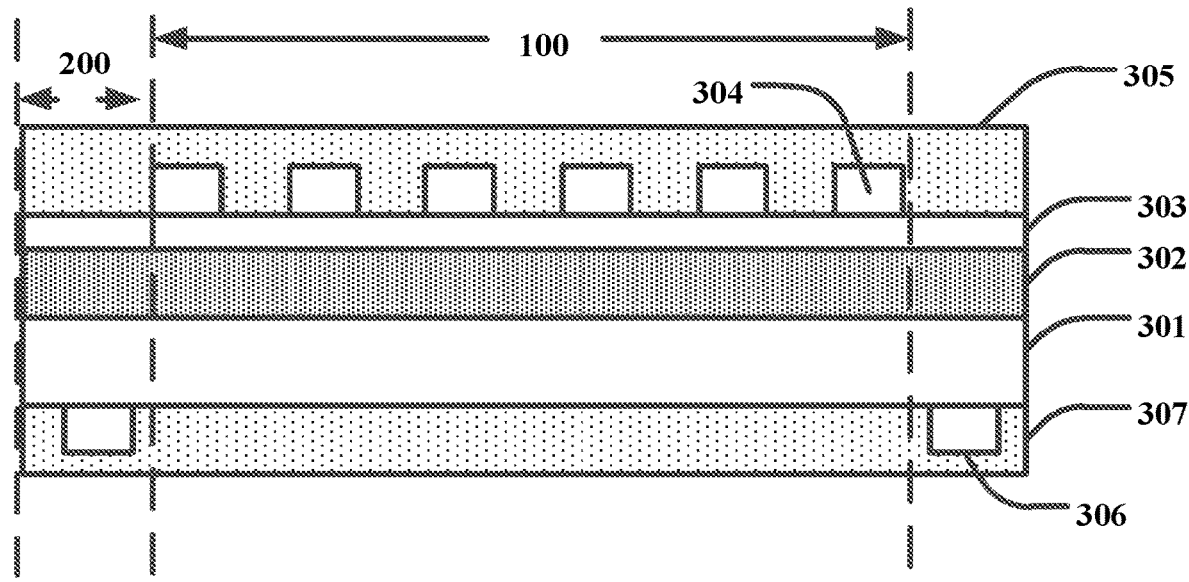
FIG. 4 is planar diagram of the display panel of the embodiment of the present disclosure.

As shown in FIG. 4, the display panel 1000 further comprises a first substrate 301, an array substrate 302, a reflective layer 303, LEDs 304, a first protective layer 305, an anti-deformation layer 306, and a second protective layer 307.

The first substrate 301 extends from the display area 100 to the non-display area 200.

The array substrate 302 is disposed on an upper surface of the first substrate 301 and extends from the display area 100 to the non-display area 200.

The reflective layer 303 is disposed on an upper surface of the array substrate 302. Material of the reflective layer 303 comprises white oil, which has a good reflection effect.

LEDs 304 are distributed on an upper surface of the reflective layer 303. Preferably, a plurality of LEDs 304 are arranged on an upper surface of the reflective layer 303 in array.

The first protective layer 305 is disposed on the upper surface of the array substrate 302 and covers upper surfaces of the LEDs 304.

The anti-deformation layer 306 is disposed on the upper surface of the first substrate 301 and located at the GOA regions 201. Material of the anti-deformation layer 306 comprises metal.

The second protective layer 307 is disposed on a lower surface of the first substrate 301 and covers a lower surface of the anti-deformation layer 306.

As shown in FIGS. 3-4, in the present embodiment, the array substrate 302 at the display area 100 comprises: a plurality of data lines 101, a plurality of scan lines 102, and a plurality of pixel units 103. The array substrate 302 at the non-display area 200 comprises: a first GOA unit 2031, a second GOA unit 2032, fan-out wires 2021, and COF circuits 2031a.

In particular, the plurality of scan lines 102 and the plurality of data lines are arranged in a crisscross manner, and two adjacent scan lines 102 and two adjacent data lines 101 enclose the pixel region 104, thereby forming a plurality of pixel regions 104 arranged in array. Each of the pixel regions 104 is provided with each of the pixel units 103, and each of the pixel units 103 corresponds to one of the LEDs 304. A switching element is further disposed in each pixel unit 103, and gates of the switching elements in each pixel unit of a same pixel row connect to a same scan line 102. Connection of the switching elements and the scan lines 102 are not shown in FIGS. 3-4, and for related content please refer to the prior art. The switching element is a thin film transistor.

A plurality of first GOA units 2031 and a plurality of second GOA units 2032 are located at the GOA regions 201, and each of the GOA units electrically connects to each scan line 102 through a switching element. The first GOA units 2031 are located at the left side of the display area 100 to drive the pixel units 103 in each odd row, and the second GOA units 2032 are located at the right side of the display area 100 to drive the pixel units 103 in each even row. Fan-out wires 2021 are located at the fan-out region 202, and are disposed in the non-display area 200 except the GOA regions 201. In other words, the fan-out wires 2021 are disposed at one side of the display area 100 except for the left side where the first GOA units are connected to the display area 100 and the right side where the second GOA units are connected to the display area 100. Preferably, the fan-out wires 2021 are disposed at a lower side of the display area 100. Wherein, the fan-out wires 2021 include data signal lines connected to the data lines 101 and GOA signal lines 402 connected to the GOA. The COF circuits 2031a are located at the COF region 203 and connect to the fan-out wires.

Figure 5:
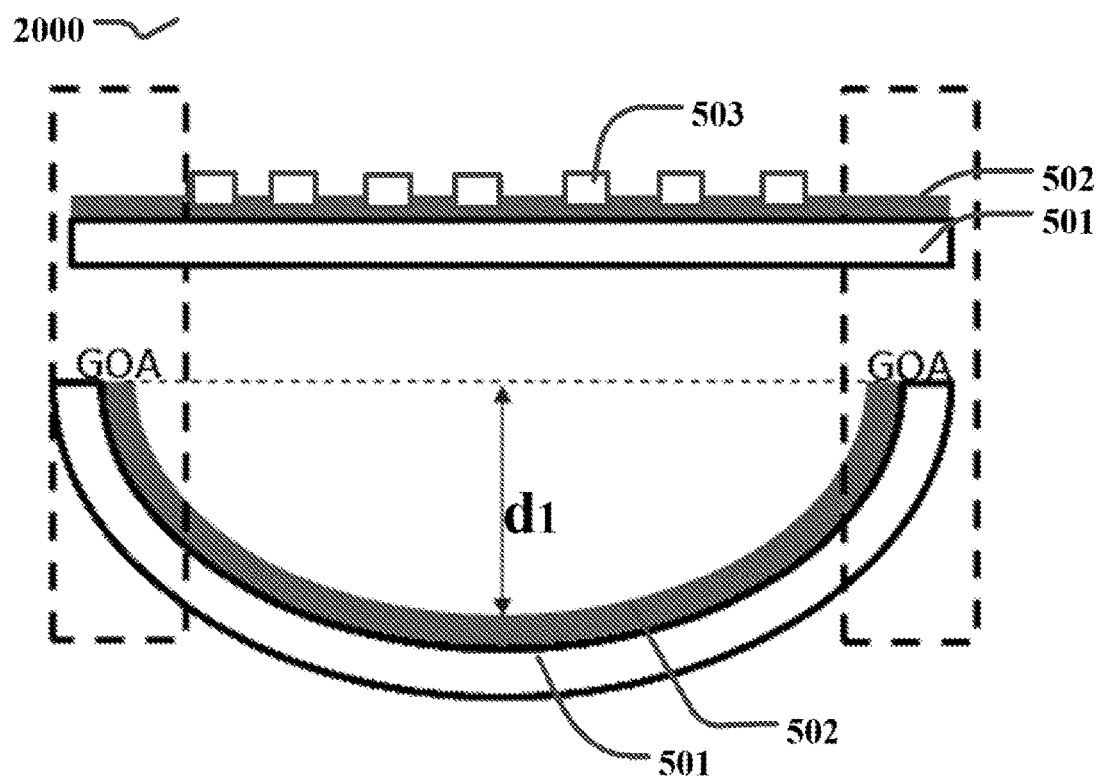
FIG. 5 is a schematic structural diagram of warpage deformation of a first substrate and an array substrate of the display panel in the prior art.

As shown in FIG. 5, no elements are disposed under the existing display panel 2000. A thermal expansion coefficient of the first substrate 501 is inconsistent with the thermal expansion coefficient of metal wires (such as copper, aluminum, molybdenum, etc.) in the array substrate 502, and subsequent processes of forming the reflective layer on the array substrate 502, setting the LEDs, and bonding are all high-temperature processes. Therefore, after these processes are completed, the metal wires in the array substrate 502 will cool to room temperature and then shrink. At this time, the first substrate 501 and the array substrate 502 will be warped to different degrees, and the deformation is d1, which affects the yield of the display panel. In addition, while using the display panel, the LED chips will generate heat, which will also cause the first substrate 501 and the array substrate 502 to warp to different degrees. If the warpage is severe, the LEDs 503 may be dimmed or extinguished under stress.

Figure 6:
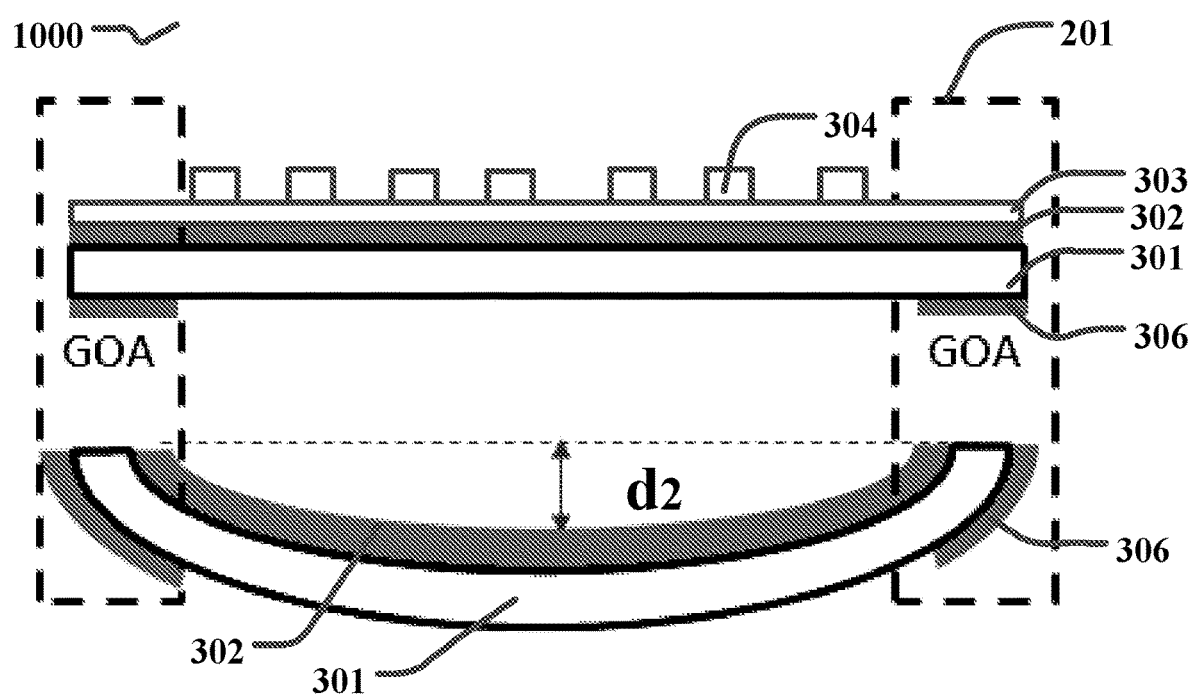
FIG. 6 is a schematic structural diagram of warpage deformation of a first substrate and an array substrate in the embodiment of the present disclosure.

As shown in FIG. 6, in the display panel 1000 provided in the embodiment of the present disclosure, the GOA regions 201 are disposed at two opposite edges of the display area. Since metal wires of the GOA regions 201 are dense, warpage of the first substrate 301 and the array substrate 302 is aggravated. The deformation of the first substrate 301 and the array substrate 302 is d2, by comparing FIG. 5 and FIG. 6, it can be seen that d2 is far less than d1. Therefore, an anti-deformation layer 306 is disposed on a lower surface of the first substrate 301 at a position corresponding to the GOA regions 201, wherein metal materials of the GOA regions 201 are the same as the anti-deformation layer 306, so that the metal thermal expansion coefficients of the upper and lower surfaces of the first substrate 301 are the same, thereby effectively reducing the warpage of the first substrate 301 and the array substrate 302.

Compared with the prior art, in the display panel 1000 provided in the embodiment of the present disclosure, when realizing a large-size display panel, the GOA regions are disposed at two opposite edges of the display area. There is no need to splice multiple small-size display panels, and only the number of data signal lines needs to be increased, which is beneficial to control the number of circuit wires in the COF region, thereby saving production costs. Furthermore, since the large-size display panel 1000 does not need to be spliced, it solves the problem of large splicing gaps of small-size display panels, and realizes the function of no splicing in the plane, free border design, easy realization of left and right dual drive, and high number of partitions.

Figure 7:
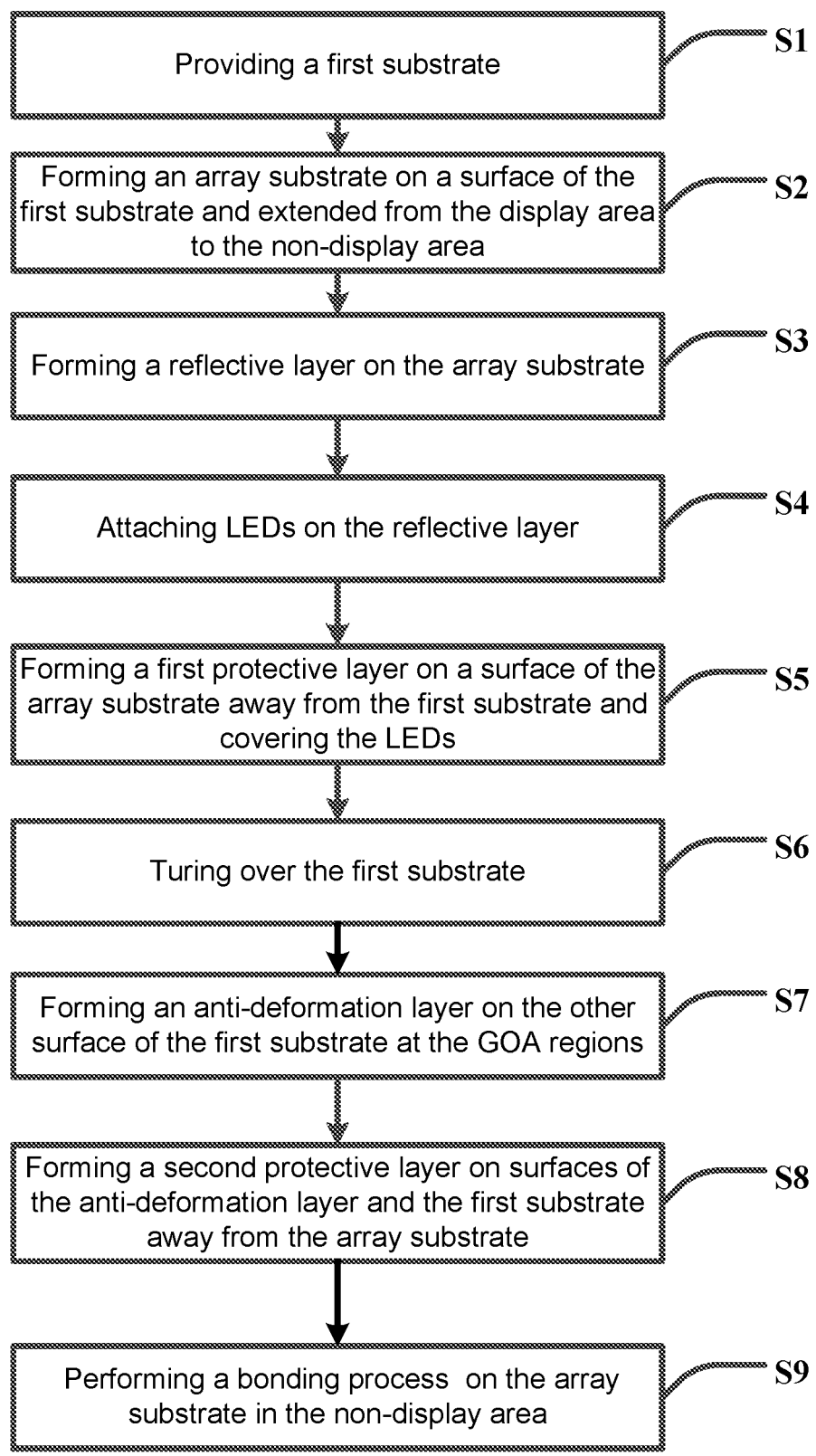
FIG. 7 is a manufacturing method of the display panel in the embodiment of the present disclosure.

As shown in FIG. 7, the present disclosure further provides a manufacturing method for manufacturing the display panel mentioned above. The display panel comprises a display area and a non-display area surrounding the display area, and the non-display area has GOA regions. The manufacturing method comprises steps S1 to S9 as follows.

S1: a first substrate is provided.

S2: an array substrate is formed on a surface of the first substrate, and the array substrate extends form the display area to the non-display area. Specifically, the step of forming the array substrate on the surface of the first substrate comprises:

In the display area, a plurality of data lines, a plurality of scan lines, and a plurality of pixel units are formed. Wherein, the plurality of scan lines and the plurality of data lines are disposed in a crisscross manner, and two adjacent scan lines and two adjacent data lines enclose a pixel region to form a plurality of pixel regions arranged in array, wherein each of the pixel regions is provided with each of the pixel units, and each of the pixel units corresponds to an LED. In the GOA regions, a plurality of first GOA units and a plurality of second GOA units are formed, and the first GOA units and the second GOA units are disposed at two opposite edges of the display area, respectively. Fan-out wires are formed in the non-display area except the GOA regions. The COF circuits are formed in the non-display area at the position closed to the fan-out wires to connect to the fan-out wires.

S3: a reflective layer is formed on the array substrate. Material of the reflective layer comprises white oil, which has good reflection effect.

S4: the LEDs are attached on the reflective layer. Specifically, a plurality of LEDs are distributed on an upper surface of the reflective layer in array.

S5: a first protective layer is formed on a surface of the array substrate away from first substrate and covers the LEDs.

S6: the first substrate is turned over. After the first substrate is turned over, the array substrate, the reflective layer, the LEDs, and the first protective layer are disposed on a lower surface of the first substrate in sequence.

S7: an anti-deformation layer is formed on the other surface of the first substrate and in the GOA regions.

S8: a second protective layer is formed on surfaces of the anti-deformation layer and the first substrate away from the array substrate.

S9: a bonding process is performed on the array substrate in the non-display area. Specifically, the bonding process is performed on the GOA regions, the fan-out wires, and a FPC circuit.

In the present embodiment, regardless of whether the step of forming the array substrate, the reflective layer, the LEDs, and the first protective layer on a surface of the first substrate is before or after the step of forming the anti-deformation layer and the second protective layer on the other surface, as long as the display panel to be formed subsequently can be disposed on the lower surface of the first substrate and the anti-deformation layer can be disposed at a position corresponding to the GOA regions, the present embodiment is not particularly limited.

As shown in FIG. 5, no elements are disposed under the existing display panel 2000. The thermal expansion coefficient of the first substrate 501 is inconsistent with the thermal expansion coefficient of the metal wires (such as copper, aluminum, molybdenum, etc.) in the array substrate 502, and the subsequent processes of forming reflective layer on the array substrate 502, setting the LEDs, and bonding are all high-temperature processes. Therefore, after these processes are completed, the metal wires in the array substrate 502 will cool to room temperature and then shrink. At this time, the first substrate 501 and the array substrate 502 will be warped to different degrees, and the deformation is d1, which affects the yield of the display panel. In addition, while using the display panel, the LEDs will generate heat, which will also cause the first substrate 501 and the array substrate 502 to warp to different degrees, and if the warpage is severe, the LEDs 503 may be dimmed or extinguished under stress.

As shown in FIG. 6, in the display panel 1000 provided in the embodiment of the present disclosure, the GOA regions 201 are disposed at two opposite edges of the display area. Since the metal wires of the GOA regions 201 are dense, the warpage of the first substrate 301 and the array substrate 302 is aggravated. The deformation of the first substrate 301 and the array substrate 302 is d2, by comparing of FIG. 5 and FIG. 6, it can be seen that d2 is far less than d1. Therefore, by setting the anti-deformation layer 306 on the lower surface of the first substrate 301 at the position corresponding to the GOA regions 201, wherein the metal materials of the GOA regions 201 are the same as the anti-deformation layer 306, the metal thermal expansion coefficients of the upper and lower surfaces of the first substrate 301 are the same, thereby effectively reducing the warpage of the first substrate 301 and the array substrate 302.

Compared with the prior art, in the display panel 1000 provided in the embodiment of the present embodiment, when realizing a large-size display panel, the GOA regions are set at two opposite edges of the display area. There is no need to splice multiple small-size display panels, and only the number of data signal lines needs to be increased, which is beneficial to control the number of circuit wires in the COF region, thereby saving production costs. Furthermore, since the large-size display panel 1000 does not need to be spliced, it solves the problem of large splicing gaps of small-size display panels, and realizes the function of no splicing in the plane, free border design, easy realization of left and right dual drive, and high number of partitions.

The present disclosure further provides a display device, which comprises the display panel mentioned above. The display device may be any products or elements with display functions such as electronic paper, mobile phones, tablet computers, televisions, monitors, notebook computers, digital photo frames, navigators, etc.

In the above-mentioned embodiments, the description of each embodiment has its own focus. For parts that are not described in detail in an embodiment, reference may be made to related descriptions of other embodiments.

The above provides a detailed introduction to a display panel, a manufacturing method thereof, and a display device provided in the embodiments of the present disclosure. Specific examples are used in this article to illustrate the principles and implementations of the present disclosure. The description of the above embodiments is only for help to understand the technical solution of the present disclosure and its core ideas; those of ordinary skill in the art should understand that, they can still modify the technical solutions recorded in the foregoing embodiments, or equivalently replace some of the technical features; and these modifications or replacements do not cause the essence of the corresponding technical solutions to deviate from the scope of the technical solutions of the embodiments of the present disclosure.

What is claimed is:

1. A manufacturing method for manufacturing a display panel, wherein the display panel comprises a display area and a non-display area around the display area, and the non-display area has gate driver on array (GOA) regions, wherein the manufacturing method comprises following steps:
    providing a first substrate;
    forming an array substrate on a surface of the first substrate and extending from the display area to the non-display area; and
    forming an anti-deformation layer on the surface of the first substrate away from the array substrate at the GOA regions;
    wherein after the step of forming the array substrate on the surface of the first substrate and before the step of forming the anti-deformation layer, the manufacturing method further comprises:
    forming a reflective layer on the array substrate;
    attaching a plurality of light-emitting diodes (LEDs) on the reflective layer; and
    forming a first protective layer on the surface of the array substrate away from the first substrate and covering the plurality of LEDs; and
    wherein after the step of forming the anti-deformation layer, the manufacturing method further comprises:
    forming a second protective layer on the surface of the first substrate away from the array substrate and covering the anti-deformation layer.

2. The manufacturing method of claim 1, wherein the step of forming the array substrate on the surface of the first substrate comprises:
    forming a plurality of data lines, a plurality of scan lines, and a plurality of pixel units, wherein the plurality of scan lines and the plurality of data lines are arranged in a crisscross manner, and two adjacent scan lines and two adjacent data lines enclose a pixel region to form a plurality of pixel regions arranged in array, wherein each of the pixel regions is provided with each of the pixel units, and each of the pixel units corresponds to each of the LEDs.

3. The manufacturing method of claim 2, wherein the step of forming the array substrate on the surface of the first substrate further comprises:
    forming a plurality of first GOA units and a plurality of second GOA units in the GOA regions, and the first GOA units and the second GOA units are disposed at two opposite edges of the display area, respectively;
    forming a plurality of fan-out wires in the non-display area except the GOA regions; and
    forming a plurality of chip on film (COF) circuits connected to the fan-out wires in the non-display area close to a position of the fan-out wires.

4. The manufacturing method of claim 1, wherein after the step of forming the second protective layer, the manufacturing method further comprises: performing a bonding process on the array substrate in the non-display area.

5. The manufacturing method of claim 1, wherein material of the anti-deformation layer comprises metal.

6. The manufacturing method of claim 1, wherein material of the reflective layer comprises white oil.

7. A display device, comprising the display panel manufactured by the manufacturing method of claim 1.

8. The display device of claim 7, wherein the array substrate located at the display area comprises:
    a plurality of data lines, a plurality of scan lines, and a plurality of pixel units, wherein the plurality of scan lines and the plurality of data lines are arranged in a crisscross manner, and two adjacent scan lines and two adjacent data lines enclose a pixel region to form a plurality of pixel regions arranged in array, wherein each of the pixel regions is provided with each of the pixel units, and each of the pixel units corresponds to each of the LEDs.

9. The display device of claim 7, wherein the array substrate located at the non-display area comprises:
    a plurality of first GOA units and a plurality of second GOA units located at the GOA regions, and the first GOA units and the second GOA units are disposed at two opposite edges of the display area, respectively;
    a plurality of fan-out wires disposed in the non-display area except the GOA regions; and
    a plurality of chip on film (COF) circuits connected to the fan-out wires.

10. The display device of claim 7, wherein the display device is electronic paper, mobile phones, tablet computers, televisions, monitors, notebook computers, digital photo frames, or navigators.

11. A display panel manufactured by the manufacturing method of claim 1.

12. The display panel of claim 11, wherein material of the reflective layer comprises white oil.

13. The display panel of claim 11, wherein the array substrate at the display area comprises:
   a plurality of data lines, a plurality of scan lines, and a plurality of pixel units, wherein the plurality of scan lines and the plurality of data lines are arranged in a crisscross manner, and two adjacent scan lines and two adjacent data lines enclose a pixel region to form a plurality of pixel regions arranged in array, wherein each of the pixel regions is provided with each of the pixel units, and each of the pixel units corresponds to each of the LEDs.

14. The display panel of claim 11, wherein the array substrate located at the non-display area comprises:
   a plurality of first GOA units and a plurality of second GOA units located in the GOA regions, and the first GOA units and the second GOA units are located at two opposite edges of the display area, respectively;
   a plurality of fan-out wires located at the non-display area except the GOA regions; and
   a plurality of chip on film (COF) circuits connected to the fan-out wires.

15. The display panel of claim 11, wherein material of the anti-deformation layer comprises metal.

* * * * *